United States Patent
Guilford et al.

(10) Patent No.: US 12,405,893 B2
(45) Date of Patent: Sep. 2, 2025

(54) TECHNOLOGY FOR EARLY ABORT OF COMPRESSION ACCELERATION

(71) Applicant: Intel Corporation, Santa Clara, CA (US)

(72) Inventors: James David Guilford, Northborough, MA (US); Vinodh Gopal, Westborough, MA (US); Daniel Frederick Cutter, Maynard, MA (US)

(73) Assignee: Intel Corporation, Santa Clara, CA (US)

( * ) Notice: Subject to any disclaimer, the term of this patent is extended or adjusted under 35 U.S.C. 154(b) by 894 days.

(21) Appl. No.: 17/304,656

(22) Filed: Jun. 24, 2021

(65) Prior Publication Data

US 2022/0414014 A1 Dec. 29, 2022

(51) Int. Cl.
*G06F 12/0875* (2016.01)
*G06F 12/02* (2006.01)
(Continued)

(52) U.S. Cl.
CPC ...... *G06F 12/0875* (2013.01); *G06F 12/0238* (2013.01); *G06F 12/0638* (2013.01);
(Continued)

(58) Field of Classification Search
CPC .............. G06F 12/0875; G06F 12/0891; G06F 12/0638; G06F 12/0238; G06F 12/126;
(Continued)

(56) References Cited

U.S. PATENT DOCUMENTS

| | | | |
|---|---|---|---|
| 6,961,473 B1 | 11/2005 | Mitchell et al. | |
| 9,531,403 B2 | 12/2016 | Kruus et al. | |

(Continued)

FOREIGN PATENT DOCUMENTS

| | | |
|---|---|---|
| WO | 99/41668 A1 | 8/1999 |
| WO | 2012/053015 A2 | 4/2012 |

OTHER PUBLICATIONS

Decision to grant a European patent, EP App. No. 22159362.7, Jan. 18, 2024, 2 pages.
(Continued)

*Primary Examiner* — Jared I Rutz
*Assistant Examiner* — Edward Waddy, Jr.
(74) *Attorney, Agent, or Firm* — Nicholson De Vos Webster & Elliott LLP

(57) ABSTRACT

An integrated circuit includes a compression accelerator to process a request from software to compress source data into an output file. The compression accelerator includes early-abort circuitry to provide for early abort of compression operations. In particular, the compression accelerator uses a predetermined sample size to compute an estimated size for a portion of the output file. The sample size specifies how much of the source data is to be analyzed before computing the estimated size. The compression accelerator also determines whether the estimated size reflects an acceptable amount of compression, based on a predetermined early-abort threshold. The compression accelerator aborts the request if the estimated size does not reflect the acceptable amount of compression. The compression accelerator may complete the request if the estimated size reflects the acceptable amount of compression. Other embodiments are described and claimed.

20 Claims, 7 Drawing Sheets

(51) Int. Cl.
  *G06F 12/06* (2006.01)
  *G06F 12/0891* (2016.01)
  *G06F 12/126* (2016.01)
(52) U.S. Cl.
  CPC ........ *G06F 12/0891* (2013.01); *G06F 12/126* (2013.01); *G06F 2212/401* (2013.01)
(58) Field of Classification Search
  CPC ... G06F 2212/401; G06F 3/061; G06F 3/0638
  USPC ................ 711/125, 100, 118, 171, 113, 203
  See application file for complete search history.

(56) References Cited

U.S. PATENT DOCUMENTS

| | | | |
|---|---|---|---|
| 10,366,026 B1* | 7/2019 | Diamant | G06F 12/023 |
| 10,579,591 B1 | 3/2020 | Diamant et al. | |
| 10,942,844 B2 | 3/2021 | Barbou-Des-Places et al. | |
| 2013/0262809 A1 | 10/2013 | Wegener | |
| 2015/0088945 A1* | 3/2015 | Kruus | H03M 7/6011 |
| | | | 708/203 |
| 2015/0161157 A1 | 6/2015 | Ishizaki | |
| 2015/0301946 A1* | 10/2015 | Guo | G06F 9/45558 |
| | | | 711/6 |
| 2016/0283159 A1 | 9/2016 | Gopal et al. | |
| 2017/0060934 A1* | 3/2017 | Sapuntzakis | G06F 3/064 |
| 2018/0011796 A1 | 1/2018 | Guilford et al. | |
| 2019/0109869 A1* | 4/2019 | Bailey | H04L 63/1425 |
| 2019/0393888 A1 | 12/2019 | Bergmann et al. | |
| 2020/0371709 A1* | 11/2020 | Jean | G11C 11/5642 |
| 2022/0156396 A1* | 5/2022 | Bednash | G06F 21/554 |

OTHER PUBLICATIONS

European Search Report and Search Opinion, EP App. No. 22159362.7, Aug. 30, 2022, 9 pages.
Intention to Grant, EP App. No. 22159362.7, Sep. 8, 2023, 6 pages.
International Preliminary Report on Patentability, PCT App. No. PCT/US2022/020102, Jan. 4, 2024, 6 pages.
European search report and Search Opinion, EP App. No. 24157172.8, Jun. 10, 2024, 09 pages.
Andres Lagar-Cavilla et al., "Software-Defined Far Memory in Warehouse-Scale Computers"; Apr. 13-17, 2019; https://www.cs.purdue.edu/homes/csjgwang/cloudb/WSCMemoryASPLOS19.pdf (14 pages).
Wikipedia, "Deflate"; https://en.wikipedia.org/wiki/Deflate last edited on Feb. 19, 2021, (8 pages).
Wikipedia, "zlib"; https://en.wikipedia.org/wiki/Zlib last edited on Mar. 31, 2021 (4 pages).
Wikipedia, "gzip"; https://en.wikipedia.org/wiki/Gzip last edited on Apr. 27, 2021 (4 pages).
Intel Corp., "Integrated Cryptographic and Compression Accelerators on Intel®Architecture Platforms," 2013 (5 pages).
James D. Guilford et al., "Fast Computation of Huffman Codes"; Apr. 8, 2016; https://software.intel.com/content/www/us/en/develop/articles/fast-computation-of-huffman-codes.html (9 pages).
"Huffman Coding: A CS2 Assignment"; https://www2.cs.duke.edu/csed/poop/huff/info/ downloaded Jun. 8, 2021 (10 pages).
ISA/KR, International Search Report and Written Opinion for Int. Appl. No. PCT/US2022/020102 dated Jun. 14, 2022 (9 pages).
European Patent Office, Extended European Search Report for Int. Appl. No. 22159362.7 dated Aug. 30, 2022 (9 pages).

* cited by examiner

| Bits | Description |
|---|---|
| | Early-Abort Parameters 32 |
| 31:7 | Reserved *(Must be 0.)* |
| 6:5 | Sample Size<br>*(Check for early abort after the specified number of data bytes has been processed.)*<br>0: 512<br>1: 1024<br>2: 2048<br>3: 4096 |
| 4:2 | Early-Abort Threshold<br>0: Disable early aborts.<br>1: Set the Early-Abort Threshold at 1/8.<br>2: Set the Early-Abort Threshold at 2/8.<br>3: Set the Early-Abort Threshold at 3/8.<br>4: Set the Early-Abort Threshold at 4/8.<br>5: Set the Early-Abort Threshold at 5/8.<br>6: Set the Early-Abort Threshold at 6/8.<br>7: Set the Early-Abort Threshold at 7/8. |
| 1 | Write AECS Huffman Tables<br>*(This flag is reserved unless "Enable Header Generation" is non-zero.)*<br>0: The size of the AECS written is the smaller of the specified size or 64 bytes.<br>1: The size of the AECS written is the smaller of the specified size or 1568 bytes. |
| 0 | Make Complete Tables<br>*(This flag is reserved unless "Enable Header Generation" is non-zero.)*<br>0: Do not modify input statistics.<br>1: Modify input statistics. |

FIG. 2

TECHNOLOGY FOR EARLY ABORT OF COMPRESSION ACCELERATION

TECHNICAL FIELD

The present disclosure pertains in general to data processing systems and in particular to technology for compressing data.

BACKGROUND

Many data processing systems include random access memory (RAM) and non-volatile storage (NVS), with the RAM having less capacity but faster accessibility than the NVS. When software on such a data processing system needs data, the data processing system may copy that data from the NVS to the RAM. And if the RAM is already full, the data processing system may swap one or more pages of old data out of the RAM to the NVS, to make room for the new data.

Or, instead of swapping an old page to NVS, the data processing system may use a software tool to compress the old page and to copy that compressed data to another part of the RAM. For instance, an operating system that is known by the name or trademark of "Linux" (i.e., a "Linux OS") may include a tool known as "zswap" which may be used for that purpose.

However, it takes time to compress data. In addition, some data is not very compressible. Consequently, in at least some cases, a system that uses zswap may perform more poorly than a system that uses the more conventional approach of swapping old pages of data from RAM to NVS.

BRIEF DESCRIPTION OF THE DRAWINGS

Features and advantages of the present invention will become apparent from the appended claims, the following detailed description of one or more example embodiments, and the corresponding figures, in which:

FIG. 2 presents a table to illustrate an example embodiment of early-abort parameters for the compression accelerator in the data processing system of FIG. 1.

DETAILED DESCRIPTION

Figure 1:
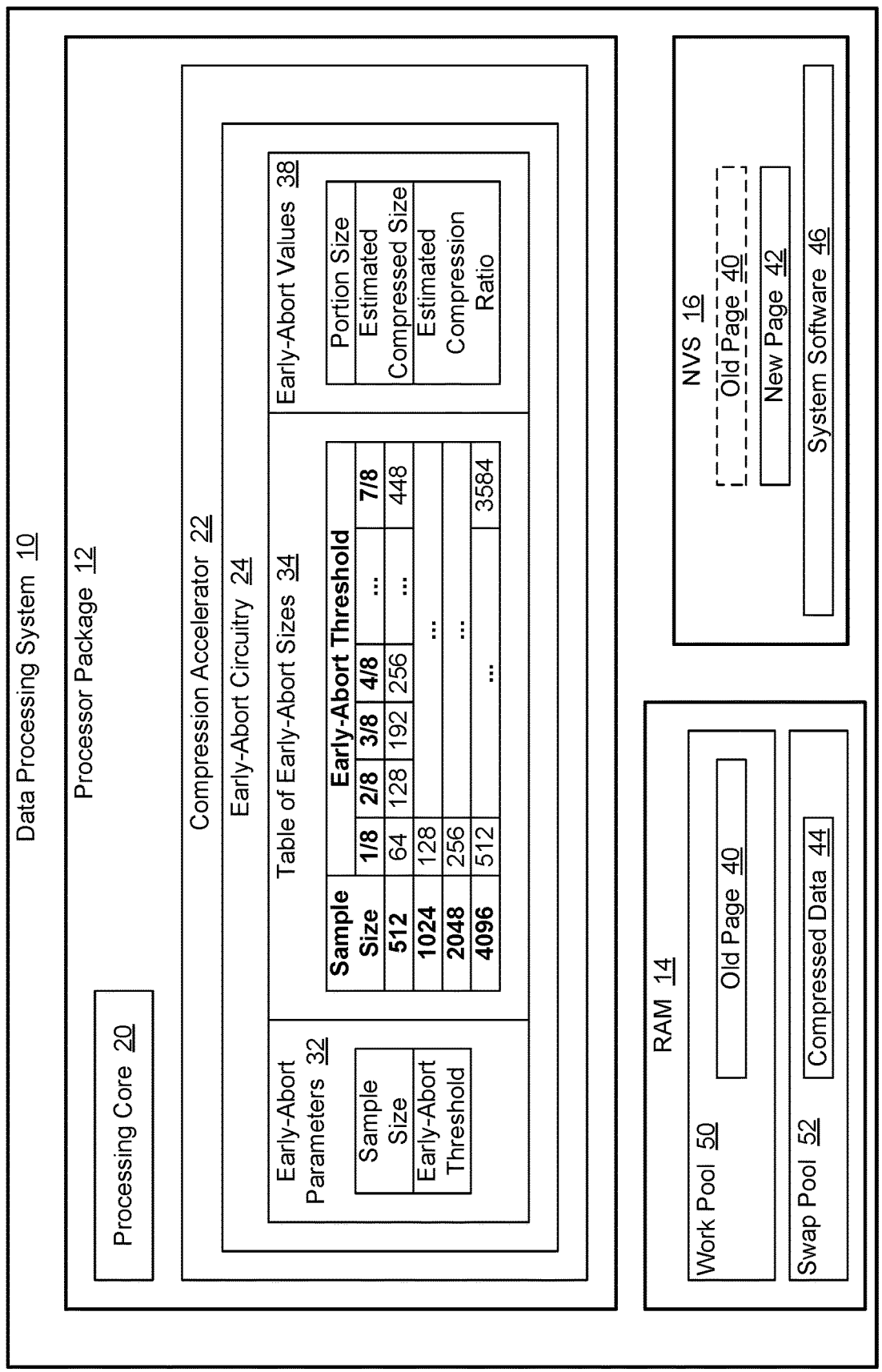
FIG. 1 is a block diagram depicting an example embodiment of a data processing system with technology for early abort of compression acceleration.

As indicated above, to make room in RAM for a new page data, a data processing system may use a tool such zswap to compress an old page and move that compressed data to another part of the RAM instead of moving the old page to NVS. For purposes of this disclosure, the area or areas of RAM which contain the data that has been "swapped in" so that it can quickly be accessed by software running on the system may be referred to as the "working area" of the RAM or as the "work pool," while the area or areas of RAM for holding data that has been "swapped out" may be referred to as the "swap area" of the RAM or as the "swap pool." And when the old page is needed again, the system decompresses the compressed data and moves that decompressed data to the work pool. Thus, a data processing system may provide for a memory hierarchy or memory tiers by using a tool like zswap to provide for a work pool and a swap pool in RAM, and to use compression and decompression at the page level when moving data between the work pool and the swap pool. For purposes of this disclosure, since that kind of process involves deciding between at least two different types of destinations for the old page, that kind of process may be referred to in general as "variable-destination swapping."

Also, for purposes of this disclosure, the input data that is to be compressed by a compression accelerator may be referred to as the "source data" or the "source file," and the compressed data that is produced may be referred to as the "output file."

In general, the goal of variable-destination swapping is to increase the effective memory capacity but with much better performance than swapping to a slower tier such as storage media. Consequently, it is important to minimize the latency for compression and decompression while maximizing the compression ratio achieved (and thereby RAM savings). The ideal performance goal is to maximize the memory savings (via page compression) with nearly zero performance impact to applications, relative to a system with a much larger RAM capacity and no compression.

In some systems, the compression and decompression tasks may be performed by software that uses relatively lightweight compression algorithms such as the algorithm known as "Lempel-Ziv-Oberhumer" (LZO). Such an algorithm has the advantage of relatively high speed, but at the cost of relatively low compression. Alternatively, a system may use a compression algorithm such as the one known as "Deflate" to achieve better compression, but at the cost of increased latency for compression and decompression. Deflate is a lossless data compression and decompression process which involves an output file format that uses a combination of Huffman coding and coding based on the data compression algorithm known as LZ77 (or coding based on a derivative or variation of LZ77, such as Lempel-Ziv-Storer-Szymanski (LZSS) coding). However, one way to reduce the latency impact of using such a heavyweight compression algorithm is to use a hardware compression accelerator, instead of a software compression tool, to implement the compression and decompression algorithm. For purposes of this disclosure, the term "accelerator" denotes a hardware compression accelerator. A compression accelerator may also be referred to as a "compression engine" or a "coprocessor."

As part of the variable-destination swapping process, software such as an operating system (OS) or a virtual machine monitor (VMM) may use an accelerator to generate compressed data, based on uncompressed source data. In particular, the software may use the accelerator in that manner as part of the compression phase of a swap-out operation to swap a page of data out of the RAM work pool.

As described in greater detail below, one way to enhance the performance of that compression phase is to implement an early-abort feature based on the characteristics of the data being compressed and based on various predetermined parameters, possibly including software defined parameters. In particular, this disclosure describes a hardware compression accelerator with early-abort circuitry which enables the accelerator to abort the compression process after analyzing only a subset of the source data, based on parameters that are programmed into the hardware accelerator by the software. In other words, the accelerator may decide not to produce compressed data as output, after analyzing only a portion of the source data.

FIG. 1 is a block diagram depicting an example embodiment of a data processing system 10 with technology for early abort of compression acceleration. In particular, data processing system 10 includes a compression accelerator 22 which includes early-abort circuitry 24 with various components that cooperate to provide early-abort functionality. In particular, early-abort circuitry 24 causes compression accelerator 22 to abort compression operations based on characteristics of the data being compressed and based on various predetermined parameters. In the embodiment of FIG. 1, early-abort circuitry 24 resides in an integrated circuit along with one or more processing cores 20 in a processor package 12. However, in other embodiments, a compression accelerator may reside in a separate integrated circuit in the processor package with one or more processing cores, or a compression accelerator may reside in a separate processor package.

Data processing system 10 also include other components in communication with processor package 12, such as RAM 14 and NVS 16. RAM 14 may be implemented using one or more dynamic RAM (DRAM) modules for example, and NVS may be implemented using one or more hard disk drives or any other suitable non-volatile data storage devices.

NVS 16 may also include system software 46 that is copied into RAM 14 and executed by processing core 20 and compression accelerator 22. System software 46 includes logic (e.g., executable instructions) to implement variable-destination swapping, including instructions for configuring RAM 14 with a work pool 50 to hold swapped-in pages and a swap pool 52 to hold swapped-out pages—or more specifically, to hold compressed data that has been generated from such pages. The logic to implement variable-destination swapping also includes logic for using compression accelerator 22 to perform compression for pages to be swapped out.

For instance, when system software 46 determines that an old page of data 40 in RAM 14 should be swapped out to make room in work pool 50 for a new page of data 42 to be swapped in to work pool 50 from NVS 16, system software 46 may use compression accelerator 22 to compress the data from old page 40 into compressed data 44. And system software 46 may then save compressed data 44 to swap pool 52. In FIG. 1, old page 40 is depicted with a dashed outline in NVS 16 to focus on a scenario in which old page 40 has been swapped in to work pool 50. But system software 46 has decided that old page 40 should be swapped out to make room for new page 42, as indicated above, and so system software 46 has used compression accelerator 22 to generate compressed data 44, based on old page 40, and system software 46 has saved compressed data 44 in swap pool 52. System software 46 may then use the space that was occupied by old page 40 in work pool 50 to swap in new page 42.

Moreover, the logic in system software 46 for using compression accelerator 22 includes logic for using early abort of compression acceleration, in cooperation with early-abort circuitry 24 in compression accelerator 22. As described in greater detail below, if early-abort circuitry 24 decides to take an early abort, compression accelerator 22 may not return compressed data, but may instead return result data such as a return code to system software 46. For instance, the return code may indicate whether processing is complete, and if so, whether early abort was taken or compressed data was produced. In particular, in one embodiment, system software 46 uses an enqueue operation to submit the compression request to compression accelerator 22, the payload of that enqueue operation includes a descriptor with 64 bytes to contain various fields, including a field for a completion record (CR), and compression accelerator 22 updates the CR with the return code. System software 46 may poll that CR to determine whether compression is complete and whether early abort was taken. For instance, a return code of zero may indicate that compression is still in process, a return code of 1 may indicate that compression was successfully completed, and any other return code may indicate that early abort was taken.

To prepare for early abort, system software 46 may load various early-abort parameters 32 into early-abort circuitry 24 in compression accelerator 22. As shown in FIG. 1, those parameters may include a sample-size parameter and an early-abort threshold parameter. As described in greater detail below, early-abort circuitry 24 may also include a table of early-abort sizes 34. System software 46 may use any suitable approach to supply early-abort parameters 32 to compression accelerator 22. As illustrated, early-abort circuitry 24 may store those parameters using various fields in a table of early-abort parameters 32. However, in various embodiments, the "table" of early-abort sizes does not need to be any particular kind of data structure. For instance, the early-abort sizes may be stored in a table, in an array, in a linked list, in a record, in a directory, etc. Accordingly, for purposes of this disclosure, the storage that is used to store the early-abort sizes may be referred to as "early-abort-size storage."

FIG. 2 presents a table to illustrate an example embodiment of early-abort parameters 32 for compression accelerator 22.

The sample size field specifies when compression accelerator 22 will perform the check to determine whether or not compression is expected to achieve at least a particular amount of size/space savings. In the embodiment of FIG. 2, for instance, system software 46 loads a value in the sample size field to select a size from the list consisting of 512 bytes, 1024 bytes, 2048 bytes, and 4096 bytes. Thus, early-abort circuitry 24 checks as soon as 512, 1024, 2048, or 4096 input bytes have been processed. Also, early-abort circuitry 24 may only check once, when the specified sample size is reached, as described in greater detail below.

The early-abort threshold field specifies the minimum compression ratio needed to continue with compression. Thus, the early-abort threshold specifies the amount of size/space savings needed to continue with compression. In general, the compression ratio indicates how much smaller the compressed output is, relative to the source data, and it may be computed as input size/output size. For instance, if the compressed output is half the size of the source data, the compression ratio is 50% or 2:1, and if the compressed output is ¼ the size of the source data, the compression ratio is 25% or 4:1. Thus, when expressed as percentages, "smaller" compression ratios reflect more effective compression, and "larger" compression ratios reflect less effective compression.

As described in greater detail below, early-abort circuitry 24 analyzes a portion of the source data, according to the sample size, and early-abort circuitry 24 computes an estimate of the compression ratio that would be achieved by compression accelerator 22 for that portion of the source data if compression were not to be aborted. In particular, compression accelerator 22 computes various early-abort values 38 to determine whether or not to take early abort. As illustrated in FIG. 1 and described in greater detail below with regard to FIG. 3, those values may include (a) a portion size to indicate how many bytes from the source data are being used to estimate the compression ratio and (b) an estimated compressed size to indicate how big (i.e., how many bytes) the corresponding compressed data would be if compression were not to be aborted. And early-abort circuitry 24 may use that portion size and that estimated compressed size to compute the estimated compression ratio. In addition, early-abort circuitry 24 may perform that analysis of the source data in parallel with the actual compression operations on that source data by compression accelerator 22.

If the estimated compression ratio is greater than the early-abort threshold, compression accelerator 22 will take an early abort. In the embodiment of FIG. 2, for instance, system software 46 loads a value into the early-abort threshold field to select a minimum compression ratio from the list consisting of ⅛, ⅖, ⅜, ⅘, ⅝, ⅚, and ⅞. Thus, the early-abort threshold can be set to require a compression ratio of at least 12.5%, at least 25%, at least 37.5%, at least 50%, at least 62.5%, at least 75%, or at least 87.5%, respectively, as described in greater detail below with regard to FIG. 3.

In addition, the early-abort threshold also serves as a flag to enable or disable early-abort functionality. In particular, system software 46 can set the early-abort threshold field to zero to disable early aborts.

As illustrated, in the embodiment of FIG. 2, early-abort parameters 32 also include fields for additional parameters affecting compression, such as one or more parameters pertaining to an analytics engine control and state (AECS) structure. The AECS structure may also be referred to simply as "AECS."

The inputs to compression accelerator 22 from system software 46 include (a) the data to be compressed (i.e., the source data) and (b) parameters for controlling the compression process, such as the sample size and early-abort threshold parameters. System software 46 may also supply other input parameters, such as a parameter to select a compress version, a parameter pertaining to statistics, etc.

The outputs from compression accelerator 22 to system software 46 include control and state information. The AECS may serve different roles at different times, including a state role and a control role. In the "control" role, system software 46 uses the AECS to input parameters that do not fit in the descriptor, such as the Huffman tables to be used in the compression. In the state role, the AECS is used to pass information from job to job in the case where a large job is broken into a series of smaller jobs (e.g., to compress a 1-megabyte (MB) file by processing it 64 kilobytes (KB) at a time). In the embodiment of FIG. 2, system software 46 may use the control-size flag to indicate whether the maximum size of the AECS is 64 bytes or 1568 bytes.

Figure 3:
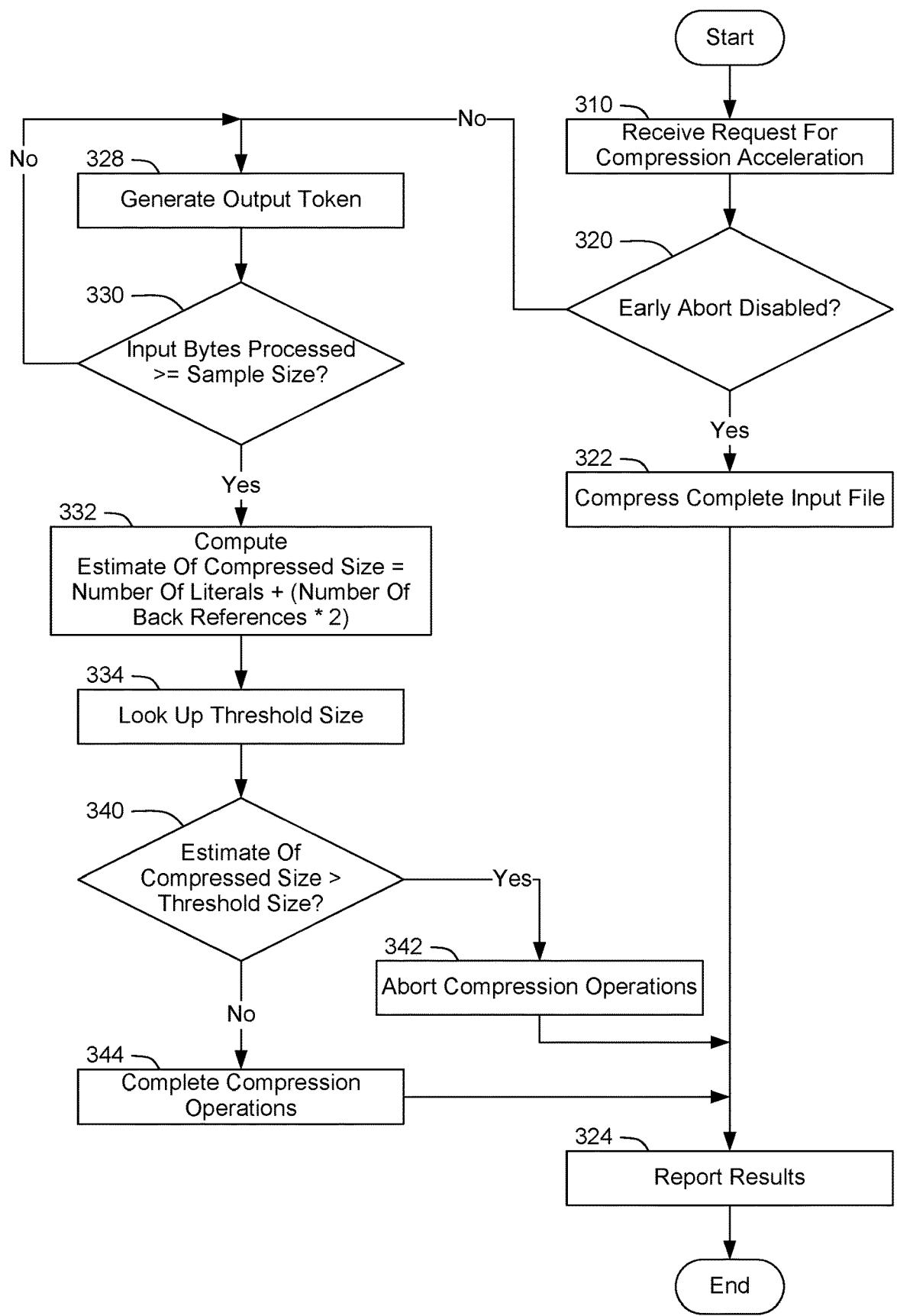
FIG. 3 presents a flowchart of an example embodiment of a process to provide for early abort of compression acceleration.

FIG. 3 presents a flowchart of an example embodiment of a process to provide for early abort of compression acceleration. That process is described in the context of data processing system 10 from FIG. 1. As shown at block 310, that process may begin with compression accelerator 22 receiving a request for compression acceleration from system software 46. For instance, in an example scenario, system software 46 is using compression accelerator 22 to compress old page 40 in connection with swapping out old page 40.

In response to the request for compression, compression accelerator 22 checks the parameters from that request to determine whether the request has enabled or disabled early abort. If system software 46 has requested for early abort to be disabled, compression accelerator 22 may generate compressed data (e.g., compressed data 44) based on the complete source data (e.g., old page 40), as shown at block 322. As shown at block 324, compression accelerator 22 may then return results to system software 46. For instance, compression accelerator 22 may set a return code to indicate that compression has been completed without abort. The process may then end.

However, referring again to block 320, if early abort is enabled, compression accelerator 22 may use early-abort circuitry 24 to determine whether to compress the entire source data or to abort the compression process without compressing the entire source data. To make that determination, early-abort circuitry 24 starts generating output tokens, based on the source data, as shown at block 328. Each output token is either a literal or a back reference, as described in greater detail below. As shown at block 330, after generating each output token, early-abort circuitry 24 determines whether the sample size has been reached. If the number of input bytes processed is not greater than or equal to the sample size, the process returns to block 328 and early-abort circuitry 24 continues to generate output tokens until the sample size has been reached.

As indicated above, the number of bytes to be processed from the source data and the early-abort threshold are controlled by two fields in early-abort parameters 32: the sample-size field and the early-abort threshold field.

When the sample size has been reached, the process passes to block 332, with early-abort circuitry 24 computing an estimate of the compressed size for the portion of the source data for which tokens were generated. In particular, early-abort circuitry 24 computes that estimate by (a) summing or counting the number of literals among the output tokens, (b) multiplying the number of back references by 2, and (c) adding those two results together. In other words, the estimate of the compressed size is the number of literals plus twice the number of references. Thus, early-abort circuitry 24 approximates the size of the output by assuming that each literal will take one byte, assuming that each reference will take two bytes, and disregarding the block header. One result or attribute of this technique or heuristic for estimating the output size is that the estimated size can never be greater than the input size, and it can only be equal if no matches were found, since the minimum match length for Deflate is three, and early-abort circuitry 24 uses an estimate of two compressed bytes.

However, in other embodiments, the early-abort circuitry may use a different formula to estimate the compressed size for the portion of the source data for which tokens were generated. For instance, if the mode of operation is compression using fixed or canned Huffman codes, which are known at the start of the operation, then the early-abort circuitry can use a more precise bit-level estimate using the symbol bit lengths for each literal or reference. Also, the early-abort circuitry may use a bit-level estimate based on suitable canned code tables that are loaded into the state of the compressor.

As shown at block 334, early-abort circuitry 24 then looks up the requested threshold size in table of early-abort sizes 34, based on the specified sample size and the specified early-abort threshold. For instance, if the sample size is 512 bytes and the early-abort threshold is 4/8, early-abort circuitry 24 retrieves a threshold size of 256 bytes from table 34.

As shown at block 340, early-abort circuitry 24 then determines whether (a) the estimated output size (i.e., the estimated size for the portion of the source data for which tokens were generated) is greater than the threshold size. For instance, in the scenario above with a sample size of 512 and an early-abort threshold of 4/8, early-abort circuitry 24 determines whether the estimated output size is greater than 256 bytes. If the estimated output size is greater than the threshold size (or, in another embodiment, greater than or equal to the threshold size), early-abort circuitry 24 aborts compression operations without processing the rest of the source data, as shown at block 342. And as shown at block 324, compression accelerator 22 reports that decision to system software 46. For instance, compression accelerator 22 may set a return code to indicate that compression has been aborted.

However, if the estimated output size is less than or equal to the threshold size (or, in another embodiment, less than the threshold size), early-abort circuitry 24 proceeds to compress the entire source data and generate compressed data 44, as shown at block 344. And compression accelerator 22 then reports the results to system software 46, as shown at block 324. For instance, compression accelerator 22 may set a return code to indicate that compression has been completed without abort. The process of FIG. 3 may then end. Thus, early-abort circuitry 24 causes compression accelerator 22 to abort a compression request if the estimated size for the output file (or a portion of the output file) reflects an unacceptably small amount of compression.

In one embodiment, early-abort circuitry 24 compares the threshold against the input bytes coming to the Deflate compressor, i.e., after the optional zero-compress pre-compression step has occurred.

Also, in other embodiments, early-abort circuitry may use other types of schedules to perform operations such as determining the estimate of compressed size and determining whether that estimated size is greater than the threshold size. For instance, early-abort circuitry may be configured to check after every "N" bytes (i.e., after N bytes, after 2N bytes, after 3N bytes, etc.) or to check after every token after crossing the N input-byte threshold. The early-abort circuitry may thus check multiple times to determine whether the estimated sizes for different portions of the output file reflect an acceptable amount of compression, and the compression accelerator may complete a compression request only if the early-abort circuitry does not detect an unacceptably small amount of compression in any of those checks.

By using the process described above, compression accelerator 22 is able to abort the compression process after analyzing only a subset of the source data. Compression accelerator 22 is thereby able to produce results more quickly than an accelerator that does not support early abort. In other words, an advantage of taking an early abort is that, if the compression is not expected to achieve a desired level of compression, the accelerator can notify the software sooner, relative to an accelerator without early-abort circuitry, and thus the latency of the process can be reduced, relative to a process that completes compression before determining whether the compression ratio is acceptable.

As indicated above in connection with block 328 of FIG. 3, each output token is either a literal or a back reference. In one embodiment, those tokens are the output of the matching portion of a Deflate compression process. That output can be considered a stream of things, and those things may be referred to as in general as token. A token can represent either a literal or a back reference. A back reference may also be referred to simply as a "reference" or a "match." A match consists of a length and distance. In the decompression process, a literal token means to output that literal byte to the output stream. A match token means to copy the specified number of bytes from the specified distance back to the output stream.

In particular, the literals and lengths may be encoded to form one Huffman alphabet (which may be referred to as the "literal and length codes" or "LL codes"), and the distances may be encoded to form another (which may be referred to as the "distance codes" or "D codes"). The decompressor first decodes an LL symbol. If it is a literal, it outputs the specified byte and looks for another LL symbol. If it is a length, it decodes the next input bits as a D symbol, processes the length/distance, and then processes the next bits as an LL symbol. Thus, the body of the Deflate block consists of mixed LL and D codes. The body can be thought of as being a mixture of either (a) a literal code (i.e., an LL code representing a literal) or (b) a length/distance pair (i.e., an LL code representing a length followed by a D code). Each literal may be considered to be one token, and each length/distance pair may be considered to be one token.

Thus, compression accelerator 22 provides for early abortion of the compression process, thereby reducing the latency experienced by system software 46 when processing source data.

In addition, early-abort may be used to increase the performance of other types of processes or application, in addition to the page swapping application. For instance, when the source data is encrypted, compressing that encrypted data may not save much space. Such source data may be referred to as relatively incompressible. A compression accelerator with early-abort circuitry may be used to quickly determine whether a file or block of source data is relatively incompressible. Accordingly, storage applications and communication applications are other types of application that can use early abort to decrease latency and increase system efficiency. The technology described herein may be used by any application that is sensitive to compression latency where there is an expectation that a non-trivial number of compression jobs may be for data that is incompressible or minimally compressible.

By contrast, a data processing system without early-abort capabilities might compress the complete source data, check the size of the compressed output, and discard the compressed output when it is too large. That approach involves increased latency and decreased system efficiency, relative to an approach that uses early abort.

In addition, the early-abort circuitry allows the system software the adjust aspects of the early-abort process such as how big a portion of the source data is to be used to estimate the compression ratio and the minimum compression ratio desired to continue with compression. Thus, the system software can adjust the parameters for different types of data sets.

Additional Embodiments

Figure 4:
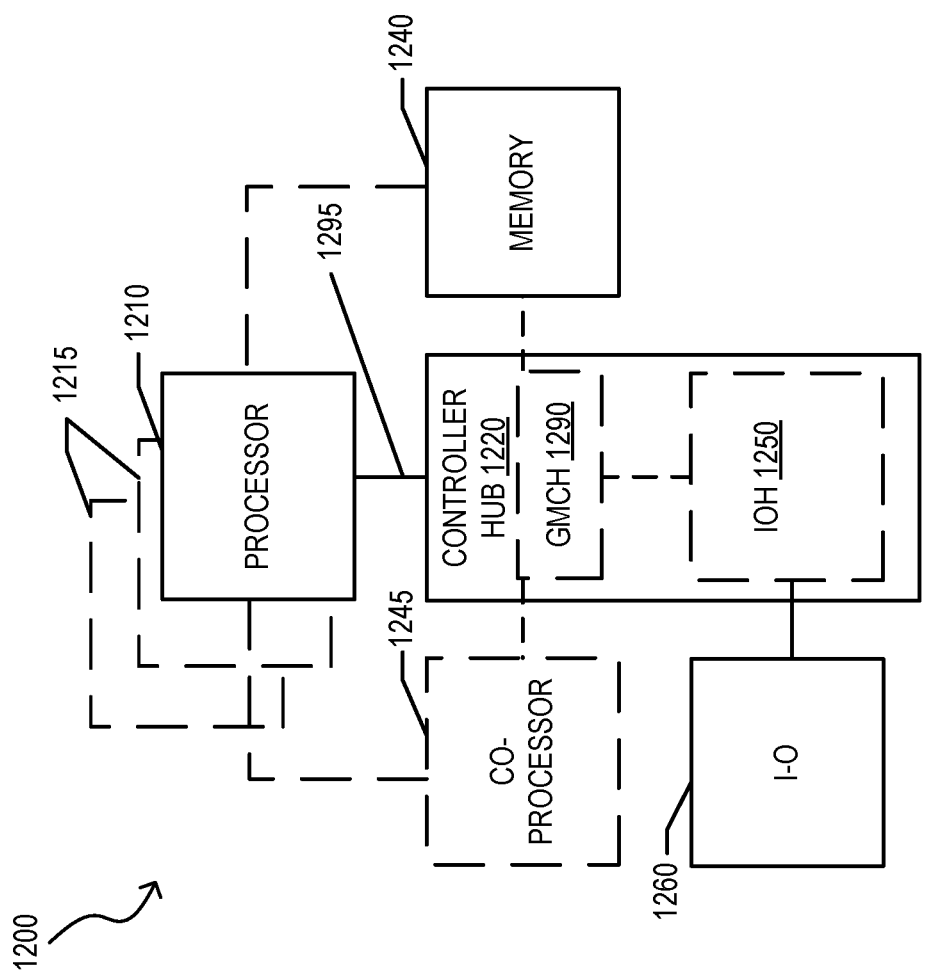
FIG. 4 is a block diagram of a system according to one or more embodiments.

FIG. 4 is a block diagram of a system 1200 according to one or more embodiments. The system 1200 may include one or more processors 1210, 1215, which are coupled to a controller hub 1220. In one embodiment, the controller hub 1220 includes a graphics memory controller hub (GMCH) 1290 and an Input/Output Hub (IOH) 1250 (which may be on separate chips); the GMCH 1290 includes a memory controller to control operations within a coupled memory and a graphics controller to which are coupled memory 1240 and a coprocessor 1245; the IOH 1250 couples input/output (I/O) devices 1260 to the GMCH 1290. Alternatively, one or both of the memory and graphics controllers are integrated within the processor, the memory 1240 and the coprocessor 1245 are coupled directly to the processor 1210, and the controller hub 1220 is in a single chip with the IOH 1250.

The optional nature of additional processors 1215 is denoted in FIG. 4 with broken lines. Each processor 1210, 1215 may include one or more processing cores and may be some version of processor 12.

The memory 1240 may be, for example, dynamic random-access memory (DRAM), phase change memory (PCM), or a combination of the two. For at least one embodiment, the controller hub 1220 communicates with the processor(s) 1210, 1215 via a multi-drop bus, such as a frontside bus (FSB), point-to-point interface such as Quick-Path Interconnect (QPI), or similar connection 1295.

In one embodiment, the coprocessor 1245 is a special-purpose processor, such as, for example, a high-throughput MIC processor, a network or communication processor, a compression engine, graphics processing unit (GPU), a general purpose GPU (GPGPU), an embedded processor, a BW accelerator, or the like. In one embodiment, controller hub 1220 may include an integrated graphics accelerator.

There can be a variety of differences between the physical resources 1210, 1215 in terms of a spectrum of metrics of merit including architectural, microarchitectural, thermal, power consumption characteristics, and the like.

In one embodiment, the processor 1210 executes instructions that control data processing operations of a general type. Embedded within the instructions may be coprocessor instructions. The processor 1210 recognizes these coprocessor instructions as being of a type that should be executed by the attached coprocessor 1245. Accordingly, the processor 1210 issues these coprocessor instructions (or control signals representing coprocessor instructions) on a coprocessor bus or other interconnect, to coprocessor 1245. Coprocessor(s) 1245 accept and execute the received coprocessor instructions.

Figure 5:
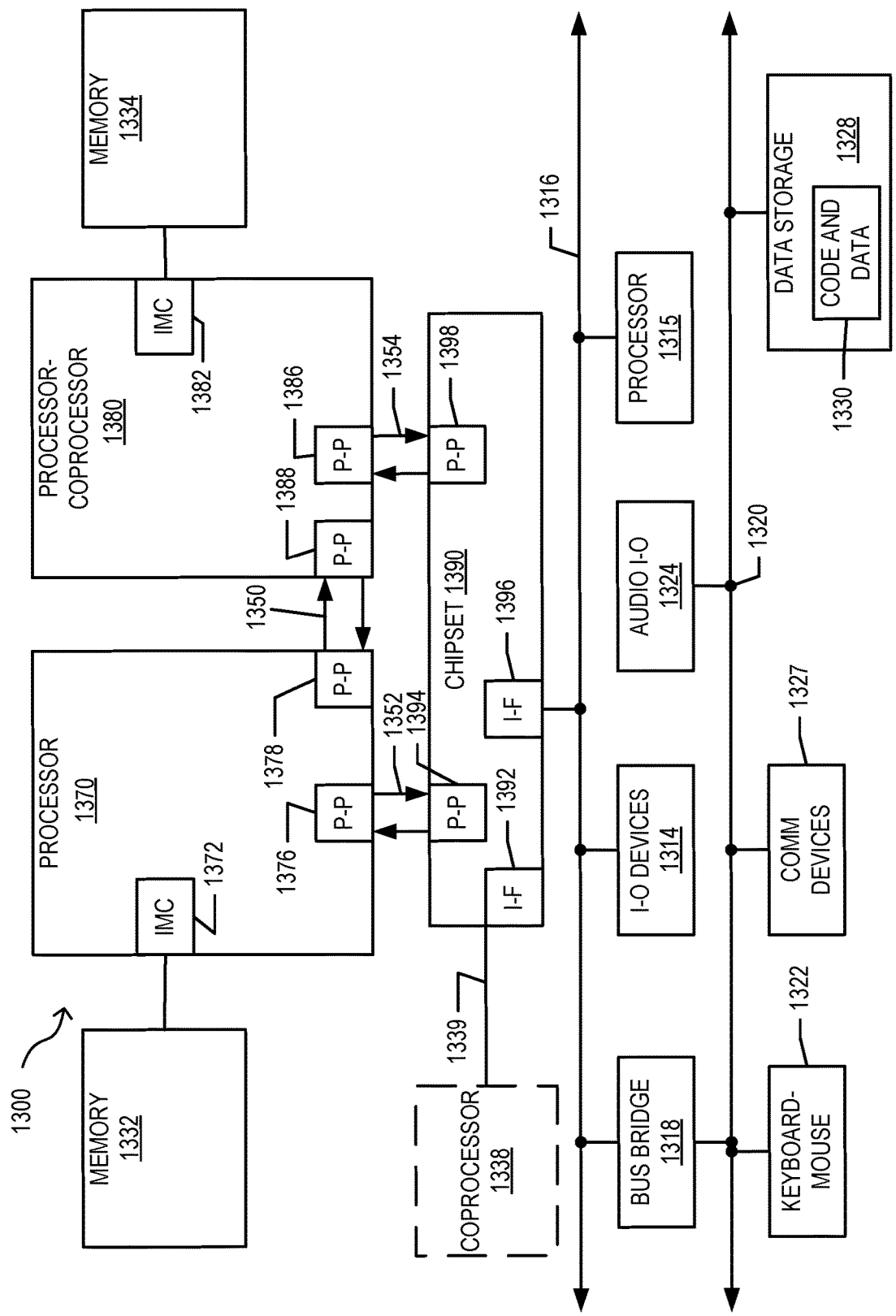
FIG. 5 is a block diagram of a first more specific exemplary system according to one or more embodiments.

FIG. 5 is a block diagram of a first more specific exemplary system 1300 according to one or more embodiments. As shown in FIG. 5, multiprocessor system 1300 is a point-to-point interconnect system, and includes a first processor 1370 and a second processor 1380 coupled via a point-to-point interconnect 1350. Each of processors 1370 and 1380 may be some version of processor 12. In one embodiment, processors 1370 and 1380 are respectively processors 1210 and 1215, while coprocessor 1338 is coprocessor 1245. In another embodiment, processors 1370 and 1380 are respectively processor 1210 and coprocessor 1245. Alternatively, processor 1380 may be a BW accelerator.

Processors 1370 and 1380 are shown including integrated memory controller (IMC) units 1372 and 1382, respectively. Processor 1370 also includes as part of its bus controller unit's point-to-point (P-P) interfaces 1376 and 1378; similarly, second processor 1380 includes P-P interfaces 1386 and 1388. Processors 1370, 1380 may exchange information via a P-P interface 1350 using P-P interface circuits 1378, 1388. As shown in FIG. 5, IMCs 1372 and 1382 couple the processors to respective memories, namely a memory 1332 and a memory 1334, which may be portions of main memory locally attached to the respective processors.

Processors 1370, 1380 may each exchange information with a chipset 1390 via individual P-P interfaces 1352, 1354 using point to point interface circuits 1376, 1394, 1386, 1398. Chipset 1390 may optionally exchange information with the coprocessor 1338 via a high-performance interface 1339. In one embodiment, the coprocessor 1338 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1390 may be coupled to a first bus 1316 via an interface 1396. In one embodiment, first bus 1316 may be a Peripheral Component Interconnect (PCI) bus, or a bus such as a PCI Express bus or another third generation I/O interconnect bus, although the scope of the present invention is not so limited.

As shown in FIG. 5, various I/O devices 1314 may be coupled to first bus 1316, along with a bus bridge 1318 which couples first bus 1316 to a second bus 1320. In one embodiment, one or more additional processors 1315, such as coprocessors, high-throughput MIC processors, GPGPUs, accelerators, (such as, e.g., graphics accelerators or digital signal processing (DSP) units), field programmable gate arrays (FPGAs), or any other processor, are coupled to first bus 1316. In one embodiment, second bus 1320 may be a low pin count (LPC) bus. Various devices may be coupled to a second bus 1320 including, for example, a keyboard and/or mouse 1322, communication devices 1327 and a storage unit 1328 such as a disk drive or other mass storage device which may include instructions/code and data 1330, in one embodiment. Further, an audio I/O 1324 may be coupled to the second bus 1320. Note that other architectures are possible. For example, instead of the point-to-point architecture of FIG. 5, a system may implement a multi-drop bus or other such architecture.

Figure 6:
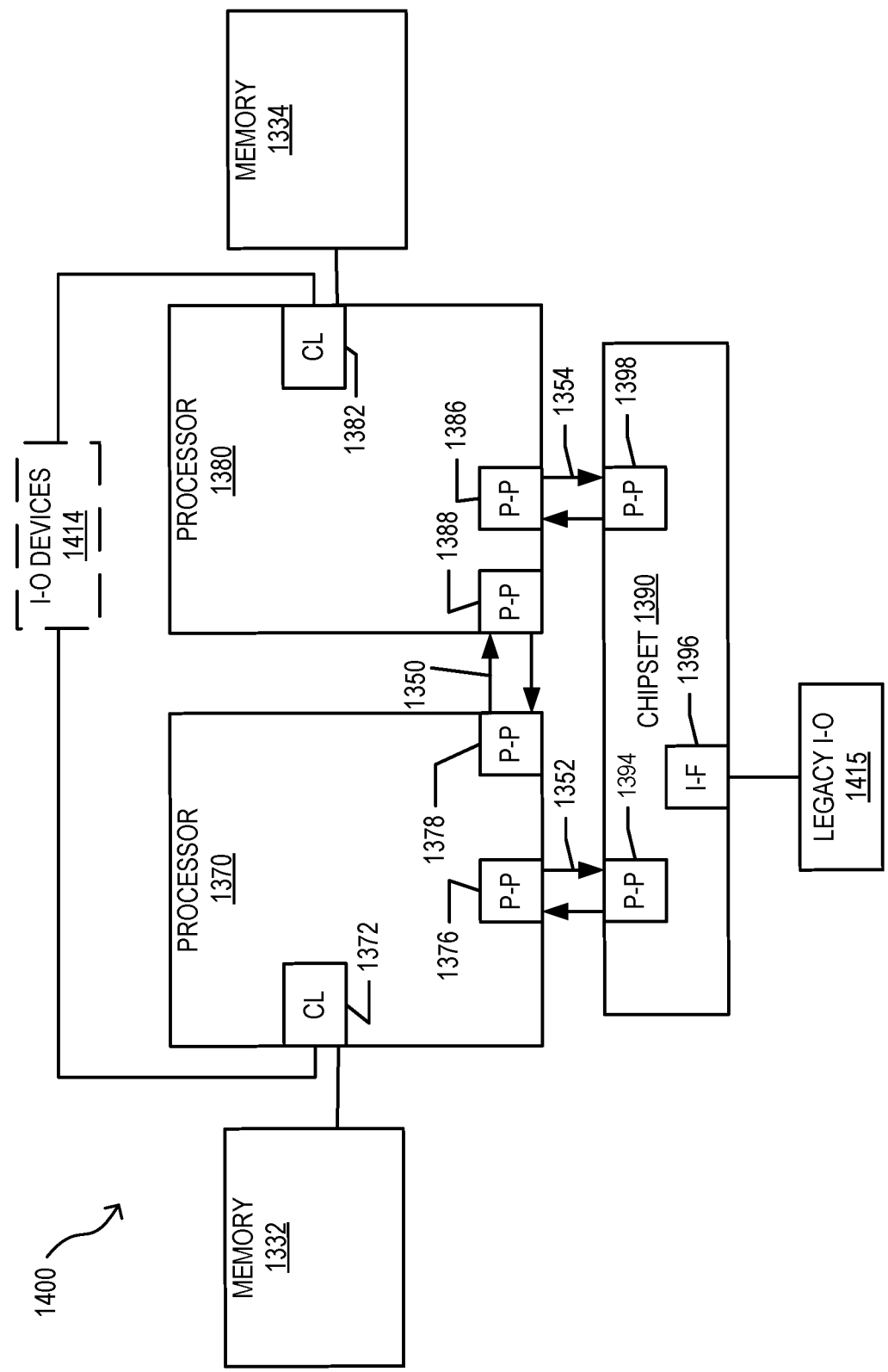
FIG. 6 is a block diagram of a second more specific exemplary system according to one or more embodiments.

FIG. 6 is a block diagram of a second more specific exemplary system 1400 in accordance with on one or more embodiments. Certain aspects of FIG. 5 have been omitted from FIG. 6 in order to avoid obscuring other aspects of FIG. 6.

FIG. 6 illustrates that the processors 1370, 1380 may include integrated memory and I/O control logic ("CL") 1372 and 1382, respectively. Thus, the CL 1372, 1382 include integrated memory controller units and include I/O control logic. FIG. 6 illustrates that not only are the memories 1332, 1334 coupled to the CL 1372, 1382, but also that I/O devices 1414 are also coupled to the control logic 1372, 1382. Legacy I/O devices 1415 are coupled to the chipset 1390.

Figure 7:
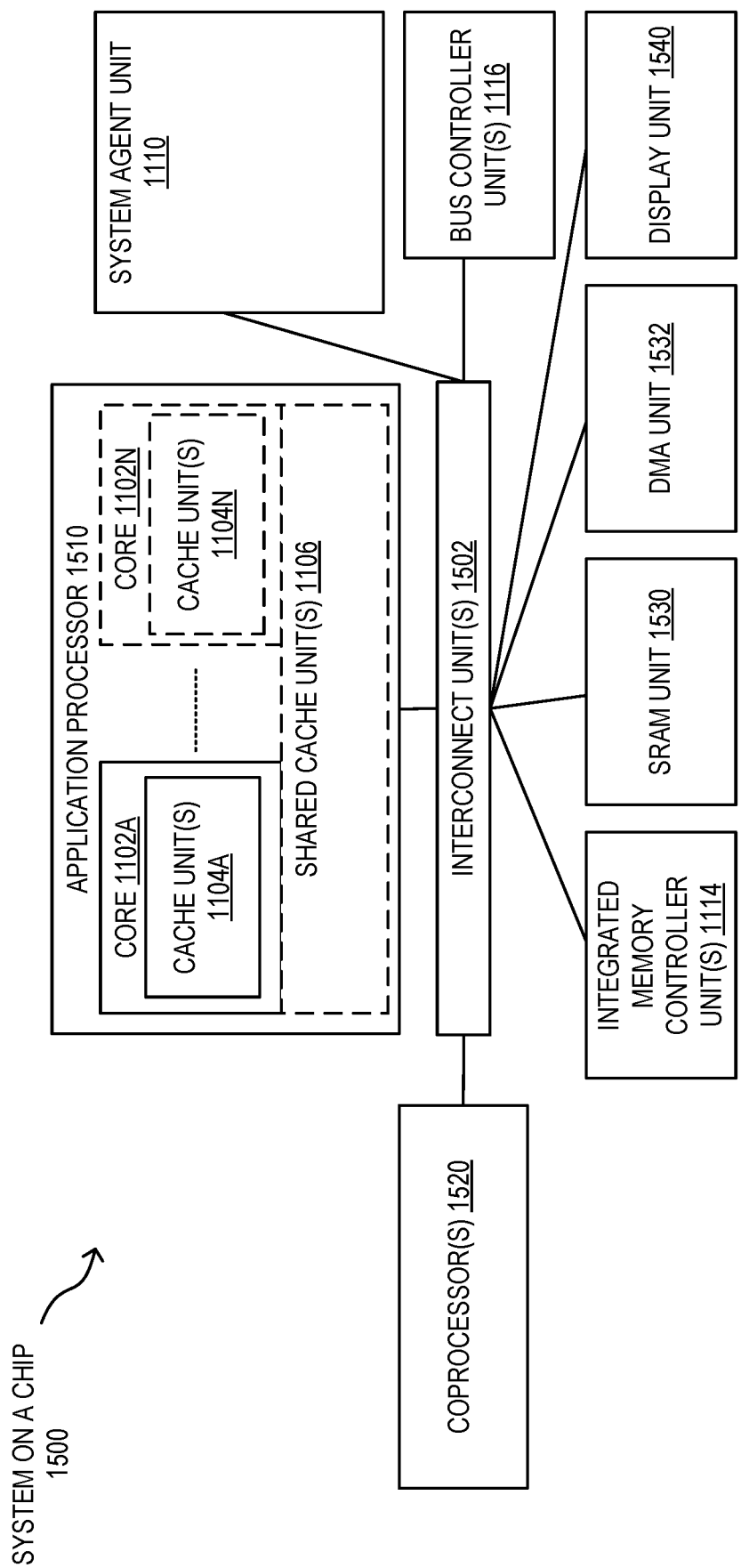
FIG. 7 is a block diagram of a system on a chip according to one or more embodiments.

FIG. 7 is a block diagram of a system on a chip (SoC) 1500 according to one or more embodiments. Dashed lined boxes are optional features on more advanced SoCs. In FIG. 7, an interconnect unit(s) 1502 is coupled to: an application processor 1510 which includes a set of one or more cores 1102A-N (including constituent cache units 1104A-N) and shared cache unit(s) 1106; a system agent unit 1110; a bus controller unit(s) 1116; an integrated memory controller unit(s) 1114; a set or one or more coprocessors 1520 which may include integrated graphics logic, an image processor, an audio processor, a video processor, and/or a BW accelerator; a static random-access memory (SRAM) unit 1530; a direct memory access (DMA) unit 1532; and a display unit 1540 for coupling to one or more external displays. In one embodiment, the coprocessor(s) 1520 include a special-purpose processor, such as, for example, a network or communication processor, compression engine, GPGPU, a high-throughput MIC processor, embedded processor, security processor, or the like.

Embodiments also include the following examples:

Example A1 is a processor package comprising an integrated circuit and a compression accelerator in the integrated circuit. The compression accelerator is to process a request to compress source data into an output file. The processor package also comprises early-abort circuitry in the compression accelerator to provide for early abort of compression operations. In particular, to provide for early abort of compression operations comprises (a) using a predetermined sample size to compute an estimated size for a portion of the output file, wherein the sample size specifies how much of the source data is to be analyzed before computing the estimated size for the portion of the output file; (b) determining whether the estimated size for the portion of the output file reflects an acceptable amount of compression, based on a predetermined early-abort threshold; and (c) causing the compression accelerator to abort the request if the estimated size for the portion of the output file does not reflect the acceptable amount of compression.

Example A2 is a processor package according to Example A1, wherein to process a request to compress source data into an output file comprises completing the request if the early-abort circuitry does not predict an unacceptably small amount of compression.

Example A3 is a processor package according to Example A1, wherein the compression accelerator is to allow software to specify the sample size and the early-abort threshold. Example A3 may also include the features of Example A2.

Example A4 is a processor package according to Example A1, wherein the operation of using the predetermined sample size to compute the estimated size for the portion of the output file comprises (a) analyzing a portion of the source data to determine a number of literals and a number of back references that could be used to compress the portion of the source data; and (b) determining the estimated size for the portion of the output file based on the determined number of literals and the determined number of back references. Example A4 may also include the features of any one or more of Examples A2-A3.

Example A5 is a processor package according to Example A4, wherein the operation of determining the estimated size for the portion of the output file based on the determined number of literals and the determined number of back references comprises computing the estimated size for the portion of the output file as one byte for each literal and two bytes for each back reference.

Example A6 is a processor package according to Example A4, wherein the operation of analyzing the portion of the source data to determine the number of literals and the number of back references that could be used to compress the portion of the source data comprises determining the number of literals and the number of back references that would be used to compress the portion of the source data according to a Deflate compression algorithm. Example A6 may also include the features of Example A5.

Example B1 is a data processing system comprising a processing core to execute software and a compression accelerator in communication with the processing core, the compression accelerator to process a request from the software to compress source data into an output file. In particular, to process a request to compress source data into an output file comprises (a) using a predetermined sample size to compute an estimated size for a portion of the output file, wherein the sample size specifies how much of the source data is to be analyzed before computing the estimated size for the portion of the output file; (b) determining whether the estimated size for the portion of the output file reflects an acceptable amount of compression, based on a predetermined early-abort threshold; and (c) aborting the request if the estimated size for the portion of the output file does not reflect the acceptable amount of compression.

Example B2 is a data processing system according to Example B1, wherein the compression accelerator comprises early-abort circuitry, and to process a request to compress source data into an output file further comprises completing the request if the early-abort circuitry does not predict an unacceptably small amount of compression.

Example B3 is a data processing system according to Example B1, wherein the data processing system comprises an integrated circuit that comprises the processing core and the compression accelerator. Example B3 may also include the features of Example B2.

Example B4 is a data processing system according to Example B 1, wherein the compression accelerator is to allow the software to specify the sample size and the early-abort threshold. Example B4 may also include the features of any one or more of Examples B2-B3.

Example B5 is a data processing system according to Example B1, wherein the operation of using the predetermined sample size to compute the estimated size for the portion of the output file comprises (a) analyzing a portion of the source data to determine a number of literals and a number of back references that could be used to compress the portion of the source data, and (b) determining the estimated size for the portion of the output file based on the determined number of literals and the determined number of back references. Example B5 may also include the features of any one or more of Examples B2-B4.

Example B6 is a data processing system according to Example B5, wherein the operation of determining the estimated size for the portion of the output file based on the determined number of literals and the determined number of back references comprises computing the estimated size for the portion of the output file as one byte for each literal and two bytes for each back reference.

Example B7 is a data processing system according to Example B5, wherein the operation of analyzing the portion of the source data to determine the number of literals and the number of back references that could be used to compress the portion of the source data comprises determining the number of literals and the number of back references that would be used to compress the portion of the source data according to a Deflate compression algorithm. Example B7 may also include the features of Example B6.

Example B8 is a data processing system according to Example B1, further comprising NVS in communication with the processing core, wherein the NVS comprises the software, and wherein the software is to specify the sample size and the early-abort threshold. Example B8 may also include the features of any one or more of Examples B2-B7.

Example B9 is a data processing system according to Example B8, further comprising RAM in communication with the processing core. Also, the software is further to (a) establish a work pool and a swap pool in the RAM; (b) store an old page in the work pool, wherein the old page comprises the source data; and (c) in connection with swapping out the old page from the work pool, (i) determine whether or not the compression accelerator aborted the request, and (ii) in response to determining that the compression accelerator did not abort the request, save the output file to the swap pool.

Example C1 is an apparatus comprising a machine-accessible medium, and instructions in the machine-accessible medium which, when executed by a data processing system with a compression accelerator with early-abort circuitry, cause the data processing system to use the compression accelerator to process a request from the software to compress source data into an output file. In particular, to process a request to compress source data into an output file comprises (a) using a predetermined sample size to compute an estimated size for a portion of the output file, wherein the sample size specifies how much of the source data is to be analyzed before computing the estimated size for the portion of the output file; (b) determining whether the estimated size for the portion of the output file reflects an acceptable amount of compression, based on a predetermined early-abort threshold; and (c) aborting the request if the estimated size for the portion of the output file does not reflect the acceptable amount of compression.

Example C2 is an apparatus according to Example C1, wherein the instruction are to specify the sample size and the early-abort threshold.

Example C3 is an apparatus according to Example C1, wherein the operation of using the predetermined sample size to compute the estimated size for the portion of the output file comprises (a) analyzing a portion of the source data to determine a number of literals and a number of back references that could be used to compress the portion of the source data; and (b) determining the estimated size for the portion of the output file based on the determined number of literals and the determined number of back references. Example C3 may also include the features of Example C2.

Example C4 is an apparatus according to Example C3, wherein the operation of determining the estimated size for the portion of the output file based on the determined number of literals and the determined number of back references comprises computing the estimated size for the portion of the output file as one byte for each literal and two bytes for each back reference.

Example C5 is an apparatus according to Example C3, wherein the operation of analyzing the portion of the source data to determine the number of literals and the number of back references that could be used to compress the portion of the source data comprises determining the number of literals and the number of back references that would be used to compress the portion of the source data according to a Deflate compression algorithm. Example C5 may also include the features of Example C4.

Example C6 is an apparatus according to Example C1, wherein to process a request to compress source data into an output file comprises completing the request if the early-abort circuitry does not predict an unacceptably small amount of compression. Also, the instructions, when executed, are further to, after completion of the request, save the output file to a swap pool in the RAM in the data processing system, in connection with swapping out the source data from a work pool in the RAM.

In light of the principles and example embodiments described in the present disclosure by text and/or illustration, one with skill in the art will recognize that the described embodiments can be modified in arrangement and detail without departing from the principles described herein. Furthermore, this disclosure uses expressions such as "one embodiment" and "another embodiment" to describe embodiment possibilities. However, those expressions are not intended to limit the scope of this disclosure to particular embodiment configurations. For instance, those expressions may reference the same embodiment or different embodiments, and those different embodiments are combinable into other embodiments.

Additionally, the present teachings may be used to advantage in many different kinds of data processing systems. Such data processing systems may include, without limitation, mainframe computers, mini-computers, supercomputers, high-performance computing systems, computing clusters, distributed computing systems, personal computers (PCs), workstations, servers, client-server systems, portable computers, laptop computers, tablet computers, entertainment devices, audio devices, video devices, audio/video devices (e.g., televisions and set-top boxes), handheld devices, smartphones, telephones, personal digital assistants (PDAs), wearable devices, vehicular processing systems, accelerators, systems on a chip (SoCs), and other devices for processing and/or transmitting information. Accordingly, unless explicitly specified otherwise or required by the context, references to any particular type of data processing system (e.g., a PC) should be understood as encompassing other types of data processing systems, as well. A data processing system may also be referred to as an "apparatus." The components of a data processing system may also be referred to as "apparatus."

Also, according to the present disclosure, a device may include instructions and other data which, when accessed by a processor, cause the device to perform particular operations. For purposes of this disclosure, instructions or other data which cause a device to perform operations may be referred to in general as "software" or "control logic". Software that is used during a boot process may be referred to as "firmware." Software that is stored in non-volatile memory may also be referred to as "firmware." Software may be organized using any suitable structure or combination of structures. Accordingly, terms like program and module may be used in general to cover a broad range of software constructs, including, without limitation, application programs, subprograms, routines, functions, procedures, drivers, libraries, data structures, processes, microcode, and other types of software components. Also, it should be understood that a software module may include more than one component, and those components may cooperate to complete the operations of the module. Also, the operations which the software causes a device to perform may include creating an operating context, instantiating a particular data structure, etc. Also, embodiments may include software that is implemented using any suitable operating environment and programming language (or combination of operating environments and programming languages). For example, program code may be implemented in a compiled language, in an interpreted language, in a procedural language, in an object-oriented language, in assembly language, in machine language, or in any other suitable language.

A medium which contains data and which allows another component to obtain that data may be referred to as a "machine-accessible medium" or a "machine-readable medium." Accordingly, embodiments may include machine-readable media containing instructions for performing some or all of the operations described herein. Such media may be referred to in general as "apparatus" and in particular as "program products." In one embodiment, software for multiple components may be stored in one machine-readable medium. In other embodiments, two or more machine-readable media may be used to store the software for one or more components. For instance, instructions for one component may be stored in one medium, and instructions another component may be stored in another medium. Or a portion of the instructions for one component may be stored in one medium, and the rest of the instructions for that component (as well instructions for other components), may be stored in one or more other media. Similarly, software that is described above as residing on a particular device in one embodiment may, in other embodiments, reside on one or more other devices. For instance, in a distributed environment, some software may be stored locally, and some may be stored remotely. The machine-readable media for some embodiments may include, without limitation, tangible non-transitory storage components such as magnetic disks, optical disks, magneto-optical disks, dynamic RAM, static RAM, non-volatile RAM (NVRAM), read-only memory (ROM), solid state drives (SSDs), phase change memory (PCM), etc., as well as processors, controllers, and other components that include data storage facilities. For purposes of this disclosure, the term "ROM" may be used in general to refer to non-volatile memory devices such as erasable programmable ROM (EPROM), electrically erasable programmable ROM (EEPROM), flash ROM, flash memory, etc.

Also, operations that are described as being performed on one particular device in one embodiment may, in other embodiments, be performed by one or more other devices. Also, although one or more example processes have been described with regard to particular operations performed in a particular sequence, numerous modifications could be applied to those processes to derive numerous alternative embodiments of the present invention. For example, alternative embodiments may include processes that use fewer than all of the disclosed operations, processes that use additional operations, and processes in which the individual operations disclosed herein are combined, subdivided, rearranged, or otherwise altered.

It should also be understood that the hardware and software components depicted herein represent functional elements that are reasonably self-contained so that each can be designed, constructed, or updated substantially independently of the others. In alternative embodiments, components may be implemented as hardware, software, or combinations of hardware and software for providing the functionality described and illustrated herein. For instance, in some embodiments, some or all of the control logic for implementing the described functionality may be implemented in hardware logic circuitry, such as with an application-specific integrated circuit (ASIC) or with a programmable gate array (PGA). Similarly, some or all of the control logic may be implemented as microcode in an integrated circuit chip. Also, terms such as "circuit" and "circuitry" may be used interchangeably herein. Those terms and terms like "logic" may be used to refer to analog circuitry, digital circuitry, processor circuitry, microcontroller circuitry, hardware logic circuitry, hard-wired circuitry, programmable circuitry, state machine circuitry, any other type of hardware component, or any suitable combination of hardware components.

Also, unless expressly specified otherwise, components that are described as being coupled to each other, in communication with each other, responsive to each other, or the like need not be in continuous communication with each other and need not be directly coupled to each other. Likewise, when one component is described as receiving data from or sending data to another component, that data may be sent or received through one or more intermediate components, unless expressly specified otherwise. In addition, some components of the data processing system may be implemented as adapter cards with interfaces (e.g., a connector) for communicating with a bus. Alternatively, devices or components may be implemented as embedded controllers, using components such as programmable or non-programmable logic devices or arrays, ASICs, embedded computers, smart cards, and the like. For purposes of this disclosure, the term "bus" includes pathways that may be shared by more than two devices, as well as point-to-point pathways. Similarly, terms such as "line," "pin," etc. should be understood as referring to a wire, a set of wires, or any other suitable conductor or set of conductors. For instance, a bus may include one or more serial links, a serial link may include one or more lanes, a lane may be composed of one or more differential signaling pairs, and the changing characteristics of the electricity that those conductors are carrying may be referred to as "signals." Also, for purpose of this disclosure, the term "processor" denotes a hardware component that is capable of executing software. For instance, a processor may be implemented as a central processing unit (CPU) or as any other suitable type of processing element. A CPU may include one or more processing cores. A processor package may also be referred to as a "processor." And a device may include one or more processors.

Other embodiments may be implemented in data and may be stored on a non-transitory storage medium, which if used by at least one machine, causes the at least one machine to fabricate at least one integrated circuit to perform one or more operations according to the present disclosure. Still further embodiments may be implemented in a computer-readable storage medium including information that, when manufactured into an SoC or other processor, is to configure the SoC or other processor to perform one or more operations according to the present disclosure. One or more aspects of at least one embodiment may be implemented by representative instructions, stored on a machine-readable medium, which represent various logic units within the processor, and which, when read by a machine, cause the machine to fabricate logic units to perform the techniques described herein. The instructions representing various logic units may be referred to as "IP cores," and they may be stored on a tangible, machine-readable medium and supplied to various customers or manufacturing facilities to load into the fabrication machines that make the logic units or the processor. One or more aspects of at least one embodiment may include machine-readable media containing instructions or design data which defines structures, circuits, apparatuses, processors and/or system features described herein. For instance, design data may be formatted in a hardware description language (HDL).

In view of the wide variety of useful permutations that may be readily derived from the example embodiments described herein, this detailed description is intended to be illustrative only, and should not be construed as limiting the scope of coverage.

What is claimed is:

1. A processor package comprising:
   a processor core; and
   a compression accelerator coupled to the processor core, the compressor accelerator to process a request to compress source data into an output file, wherein the compressor accelerator comprises early-abort circuitry to provide for early abort of compression operations, wherein the early-abort circuitry is to abort a compression job when the early-abort circuitry determines an estimated size for a portion of the output file is greater than or equal to a an input size multiplied by a configurable early abort threshold and generate an error.

2. A processor package according to claim 1, wherein the compression accelerator is to
complete the request if when the early-abort circuitry does not generate an error.

3. A processor package according to claim 1, wherein the early-abort threshold is one of 1/8, 2/8, 3/8, 4/8, 5/8, 6/8, and 7/8.

4. A processor package according to claim 1, wherein the estimated size for the portion of the output file is to be determined as a number of literals plus a number of back references.

5. A processor package according to claim 4, wherein a literal is one byte and a back reference is two bytes.

6. A processor package according to claim 1, wherein the early-abort threshold the early-abort circuitry is determine to an estimated size for a portion of the output file is greater than or equal to a an input size multiplied by a configurable early abort threshold when a configurable sample size of input bytes has been processed, wherein the configurable sample size is one of 512 bytes; 1,024 bytes; 2,048 bytes; and 4,096 bytes.

7. A data processing system comprising:
a processing core to execute software; and
a compression accelerator in communication with the processing core, the compression accelerator to process a request from the software to compress source data into an output file, wherein to process a request to compress source data into an output file comprises to:
compute an estimated size for a portion of the output file, wherein a configurable sample size is to specify how much of the source data is to be analyzed before computing the estimated size for the portion of the output file;
determine the estimated size for the portion of the output file does not at least reflect a configurable amount of compression, based on a configurable early-abort threshold; and
abort the request when the estimated size for the portion of the output file does not at least reflect the configurable amount of compression.

8. A data processing system according to claim 7, wherein:
the compression accelerator comprises early-abort circuitry; and
to process a request to compress source data into an output file further comprises to complete the request if the early-abort circuitry does not predict an abort.

9. A data processing system according to claim 7, wherein the data processing system comprises an integrated circuit that comprises the processing core and the compression accelerator.

10. A data processing system according to claim 7, wherein the the configurable sample size is one of 512 bytes; 1,024 bytes; 2,048 bytes; and 4,096 bytes and the configurable early-abort threshold is one of 1/8, 2/8, 3/8, 4/8, 5/8, 6/8, and 7/8.

11. A data processing system according to claim 7, wherein to compute the estimated size for the portion of the output file comprises to:
analyze a portion of the source data to determine a number of literals and a number of back references that could be used to compress the portion of the source data; and
determine the estimated size for the portion of the output file based on the determined number of literals and the determined number of back references.

12. A data processing system according to claim 11, wherein to determine the estimated size for the portion of the output file based on the determined number of literals and the determined number of back references comprises to
compute the estimated size for the portion of the output file as one byte for each literal and two bytes for each back reference.

13. A data processing system according to claim 7, further comprising:
non-volatile storage (NVS) to communicate with the processing core, wherein the NVS comprises the software, and wherein the software is to specify the configurable sample size and the configurable early-abort threshold.

14. A data processing system according to claim 13, further comprising:
random access memory (RAM) to communicate with the processing core; and
wherein the software is further to:
establish a work pool and a swap pool in the RAM;
store an old page in the work pool, wherein the old page comprises the source data; and
in connection with swapping out the old page from the work pool:
determine whether or not the compression accelerator aborted the request; and
in response to determining that the compression accelerator did not abort the request, save the output file to the swap pool.

15. An apparatus comprising:
a non-transitory machine-accessible medium; and
instructions in the machine-accessible medium which, when executed by a data processing system with a compression accelerator with early-abort circuitry, cause the data processing system to use the compression accelerator to process a request to compress source data into an output file, wherein to process a request to compress source data into an output file by performing a method that comprises:
computing an estimated size for a portion of the output file, wherein a configurable sample size specifies how much of the source data is to be analyzed before computing the estimated size for the portion of the output file;
determining the estimated size for the portion of the output file does not at least reflects a configurable amount of compression, based on a configurable early-abort threshold; and
aborting the request when the estimated size for the portion of the output file does not at least reflect the configurable amount of compression.

16. An apparatus according to claim 15, wherein the instructions are to specify the configurable sample size and the configurable early-abort threshold.

17. An apparatus according to claim 15, wherein computing the estimated size for the portion of the output file comprises:
analyzing a portion of the source data to determine a number of literals and a number of back references that could be used to compress the portion of the source data; and
determining the estimated size for the portion of the output file based on the determined number of literals and the determined number of back references.

18. An apparatus according to claim 17, wherein determining the estimated size for the portion of the output file based on the determined number of literals and the determined number of back references comprises:
  computing the estimated size for the portion of the output file as one byte for each literal and two bytes for each back reference.

19. An apparatus according to claim 17, wherein analyzing the portion of the source data to determine the number of literals and the number of back references that could be used to compress the portion of the source data comprises:
  determining the number of literals and the number of back references that would be used to compress the portion of the source data according to a Deflate compression algorithm.

20. An apparatus according to claim 15, wherein:
  to process a request to compress source data into an output file comprises completing the request if the early-abort circuitry does not predict an unacceptably small amount of compression; and
  the instructions, when executed, are further to:
    after completion of the request, save the output file to a swap pool in random access memory (RAM) in the data processing system, in connection with swapping out the source data from a work pool in the RAM.

* * * * *